United States Patent [19]

Rumreich et al.

[11] Patent Number: 4,718,086

[45] Date of Patent: Jan. 5, 1988

[54] AGC IN SOUND CHANNEL OF SYSTEM FOR PROCESSING A SCRAMBLED VIDEO SIGNAL

[75] Inventors: Mark F. Rumreich; Gary A. Whitledge; William A. Lagoni, all of Indianapolis, Ind.

[73] Assignee: RCA Corporation, Princeton, N.J.

[21] Appl. No.: 844,542

[22] Filed: Mar. 27, 1986

[51] Int. Cl.⁴ .................. H04N 7/167; H04N 5/52; H04N 5/44; H04N 5/60

[52] U.S. Cl. ...................... 380/20; 358/174; 358/188; 358/198

[58] Field of Search .............. 358/174, 188, 198, 114, 358/120, 122

[56] References Cited

U.S. PATENT DOCUMENTS

| | | | |
|---|---|---|---|
| 4,408,225 | 10/1983 | Ensinger et al. | 358/120 |
| 4,470,071 | 9/1984 | Rindal | 358/198 |
| 4,533,361 | 8/1985 | Corbel | 358/174 |
| 4,625,240 | 11/1986 | Yablonski et al. | 358/174 |

OTHER PUBLICATIONS

Basic Service Data for CTC-131 Color Television Receiver of RCA Corp., pp. 26, 27 and 38, 39 and 41.

Primary Examiner—Stephen C. Buczinski
Assistant Examiner—Melissa L. Koltak
Attorney, Agent, or Firm—Paul J. Rasmussen; Peter M. Emanuel; Ronald H. Kurdyla

[57] ABSTRACT

A television receiver receives a scrambled television signal of the suppressed sync pulse type. The sync pulse is restored by a decoder which provides a sync restored video signal to video signal processing circuits of the receiver, and to automatic gain control circuits of the receiver via an interface network. The interface network develops a gain control signal with a magnitude related to the magnitude of the restored sync pulse. The gain control signal is coupled to both sound and video gain control circuits for augmenting normal automatic gain control action with respect to sound and video signals.

6 Claims, 7 Drawing Figures

| CONDITION (SYNC TIP VOLTAGE) | NORMAL SYNC. $I_T$ | SUPPRESSED SYNC. | | |
|---|---|---|---|---|
| | | $I_T$ | $I$ | $I'$ |
| STEADY STATE (+1.0V) | 0 | 0 | $I_S(+)$ | $I_S(+)$ |
| HIGH GAIN (<+1.0V) | $I_S(-)$ | $I_S(-)$ | $I_S(+)$ | $I_S(+) - I_S(-)$ $\approx 2I_S(+)$ |
| LOW GAIN (>+1.0V) | $I_S(+)$ | $I_S(+)$ | $I_S(+)$ | 0 |

AGC IN SOUND CHANNEL OF SYSTEM FOR PROCESSING A SCRAMBLED VIDEO SIGNAL

This invention concerns automatic gain control (AGC) apparatus in the sound channel of a subscription television system which processes a scrambled broadcast type television signal such as a television signal having a suppressed synchronizing component.

In subscription television systems television programming signals are transmitted either "over the air" or through a suitable cable network, in scrambled form. Such signals may be descrambled for viewing by means of a suitable decoder associated with the television receiver of an authorized system subscriber. The decoder is usually situated in a converter unit located external to the television receiver.

A horizontal synchronization suppression technique is often used to scramble a broadcast television signal. In such a "suppressed sync" technique, scrambling is accomplished by suppressing the horizontal image synchronizing (sync) pulse component of the television signal. This causes the horizontal deflection system of the receiver to lock onto random video signal peaks during the active video line trace interval, rather than locking onto the actual horizontal sync pulses, thereby producing an unstable, unviewable displayed image.

Each system subscriber is provided with a decoder unit whose "front end" circuit includes conventional tuning, intermediate frequency (IF) and video detection stages. Also, an automatic gain control circuit, adapted for responding to the tips of horizontal sync pulses, is provided within the decoder for controlling the gain of the tuning and IF stages in accordance with the output of the video detection stage. A sync restoration circuit operates during the suppressed sync pulse interval of the video signal developed at the output of the video detector stage for producing standard horizontal sync pulses. These sync pulses are continuously inserted in the video signal developed at the output of the video detector stage for producing a descrambled video signal suitable for viewing. A video AGC voltage derived from some recurrent parameter in the scrambled signal is applied to video AGC circuits in the decoder. The descrambled video signal with restored sync pulses is afterwards impressed on a standard television channel RF carrier signal by means of an RF modulator, and then coupled as a descrambled RF television signal to an antenna input of the television receiver. Decoder systems for descrambling a suppressed sync video signal are discussed in U.S. Pat. No. 4,408,225 — Ensinger, et al., for example.

The size, cost and complexity of a suppressed sync video signal decoder are increased by the need for the decoder to include a tuning stage, IF stage, video detector stage, video AGC stage and RF modulator, which stages (except for the modulator) duplicate stages already found in the "front end" of a television receiver. Thus it is desirable to provide a decoder which does not require such stages. Accordingly, the Electronic Industry Association (EIA) of the United States has proposed a decoder-receiver interface standard which simplifies the design of decoders for use in suppressed sync television signal systems by eliminating the need for the aforementioned tuning, IF, detector, AGC and modulator stages in a suppressed sync decoder unit. As outlined in EIA Consumer Products Standard IS-15 "NTSC Television Receiver Audio/Video Baseband Interface Specification," the EIA decoder standard provides a mutually agreeable convention, to both television receiver manufacturers and the subscription TV industry, for the implementation of a standarized sync suppressed video decoder system.

One particularly advantageous television signal descrambling and video signal automatic gain control system suitable for the EIA standards is disclosed in my copending U.S. patent application Ser. No. 813,135 titled "Automatic Gain Control of a Scrambled Video Signal," filed Dec. 24, 1985. That system includes an interface circuit for coupling a video signal output of a suppressed sync type decoder to existing video AGC circuits of the receiver for controlling the gain of the video signal by means of a gain control signal developed by the interface circuit, without needing tuning, IF, detector, AGC and modulator stages in the decoder. The gain control signal is applied to video IF and RF stages of the receiver for augmenting the normal operation of the video AGC circuits of the receiver to establish correct video signal gain in the presence of a received suppressed sync video signal. That system employs a so-called "quasi-parallel" intermediate frequency (IF) channel in which sound and video signals are separately processed in different channels. In the sound IF channel the video IF carrier is mixed with the sound IF carrier to form a 4.5 MHz intercarrier sound signal, which is subsequently demodulated to produce an audio signal. Automatic gain control of the sound IF channel is achieved in response to a control voltage derived from the video IF carrier signal which is mixed with the sound IF carrier signal to form the intercarrier sound signal.

The use of a quasi-parallel IF channel in a television receiver advantageously reduces the likelihood of audio "buzz" being present in a demodulated audio signal. This result is particularly important in television receivers employing a wide bandwidth stereophonic sound system. However, it is herein recognized that in the television receiver system employing a quasi-parallel IF channel and suppressed sync descrambling and automatic gain control system described in copending U.S. patent application Ser. No. 813,135 mentioned previously, the sound channel AGC technique employed leads to sound degradation due to excessive amplitude modulation particularly in the presence of a scrambled suppressed sync television signal. Accordingly, there is disclosed herein a sound channel AGC technique which substantially eliminates excessive sound signal amplitude modulation under suppressed sync signal conditions.

In accordance with the principles of the present invention, it is recognized that controlling the gain of the sound channel in response to a gain control signal which is used to control the gain of the video signal channel is desirable in a quasi-parallel IF systm. More specifically, it is herein recognized that such manner of gain control can substantially eliminate amplitude modulation of the sound signal particularly under scrambled (suppressed sync) video signal conditions. In a disclosed preferred embodiment of the invention, an interface circuit responsive to a video signal output of a suppressed sync type decoder develops a gain control signal which is coupled to video signal AGC circuits of the receiver, and to sound signal AGC circuits of the receiver.

Figure 1:
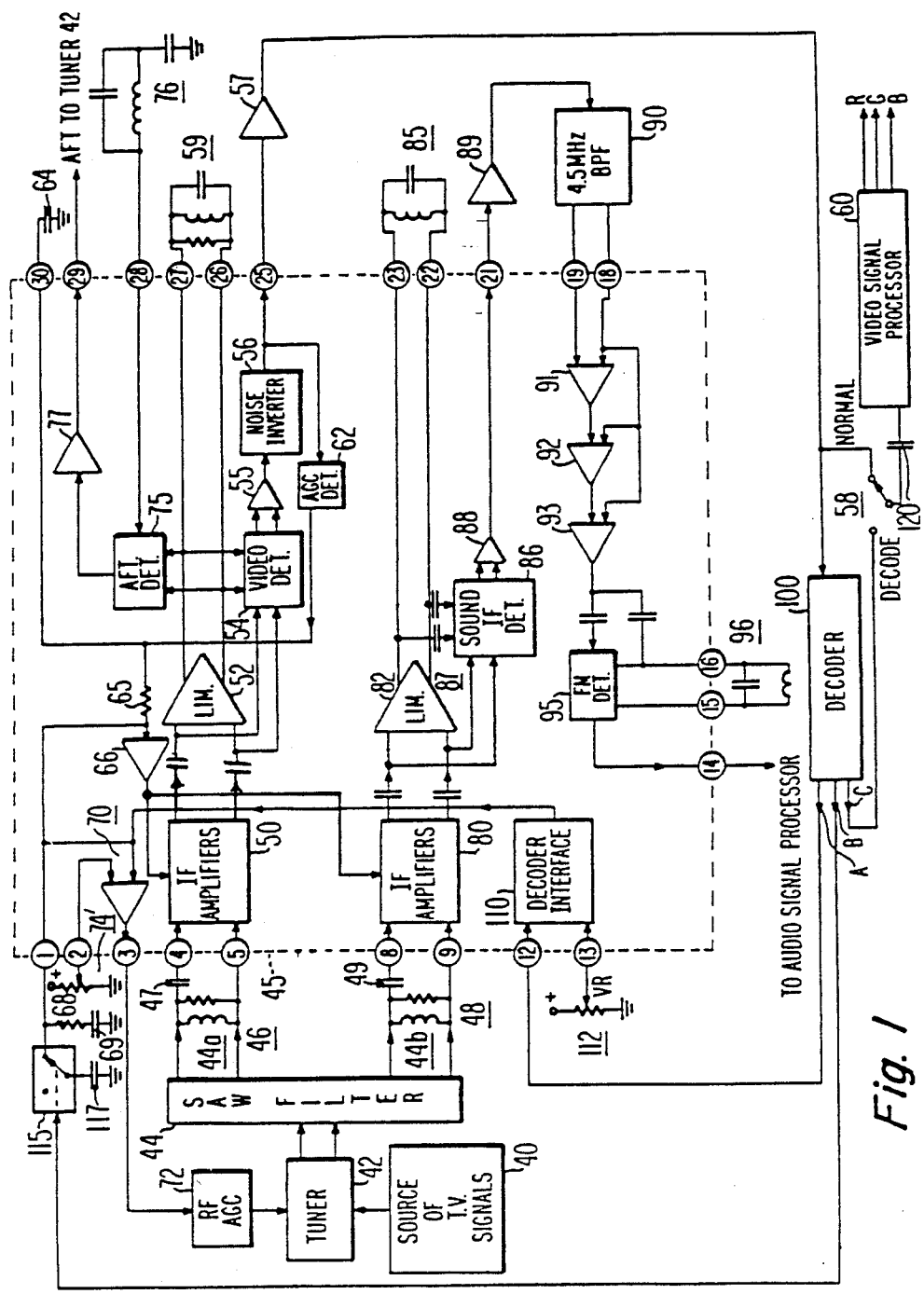
FIG. 1 shows a portion of a television receiver with apparatus according to the present invention, as well as suppressed sync restoration apparatus.

In FIG. 1, a source 40 is a source of RF television (TV) signals which include suppressed sync scrambled RF TV signals such as may be provided by a cable TV subscription service. The RF signals from source 40 are coupled to a television receiver, e.g., including a tuner 42, filter 44 and other units as will be discussed, where it is demodulated to produce scrambled video and sound representative signals. A decoder unit 100, external to the receiver, restores the sync component of the scrambled video signal, and the restored sync (unscrambled) video signal is processed by the receiver in a conventional fashion to produce an image. As will be explained in detail later, the receiver includes provision for controlling the signal gain of the tuner RF stage and the IF stage in the presence of scrambled, suppressed sync signals. In this manner separate tuner, IF and AGC stages need not be provided in decoder 100.

More specifically, in FIG. 1 tuner 42 receives the RF signals from source 40 and selectively translates the RF signal of a selected TV channel to an intermediate frequency (IF) signal including video and sound carriers at, e.g., 45.75 MHz and 41.25 MHz, respectively. The IF signal includes an amplitude modulated (AM) video carrier of the vestigial sideband type representing the composite video information, and a frequency modulated (FM) sound carrier containing the sound information.

The IF output signal from tuner 42 is coupled via a preamplifier and an adjacent channel sound trap (not shown) to inputs of a dual channel IF surface acoustic wave (SAW) filter 44 such as the T1802 SAW filter available from Toshiba Corporation. The IF signal from tuner 42 is split into two separate channels for sound and video information demodulation in accordance with the quasi-parallel principle via the dual channels of SAW filter 44, each channel exhibiting a bandpass response around the respective carriers. A first differential output 44a of SAW filter 44 associated with the video channel is coupled to signal input terminals 4 and 5 of a network 45 included e.g., in an integrated circuit, via an inductance-resistance circuit 46 which tunes out the capacitance normally associated with the SAW filter output, and via an AC coupling capacitor 47. The video channel portion of SAW filter 44 associated with output 44a exhibits a response which matches the vestigial sideband video component of the IF signal and which attenuates the 41.25 MHz sound carrier signal.

The quasi-parallel sound channel portion of SAW filter 44 associated with a differential output 44b is coupled to signal input terminals 8 and 9 of network 45 in the same manner as the video component via an inductance-resistance circuit 48 and an AC coupling capacitor 49. The sound channel portion of SAW filter 44 exhibits a double tuned response with a first peak amplitude response at the sound carrier frequency and a second peak amplitude response at the video carrier frequency.

In the video IF channel, the video component of the IF signal at input terminals 4 and 5 of network 45 is coupled to an IF amplifier stage 50 which includes plural gain controllable IF amplifiers. The amplified video component from stage 50 is AC coupled to a limiter 52 and to a video detector 54 (e.g., a four quadrant multiplier). A bandpass filter tank circuit 59 coupled via terminals 26 and 27 to the output of limiter 52 is tuned to the video carrier frequency of 45.75 MHz. Limiter 52, filter 55 and video detector 54 form a synchronous detector for producing a baseband composite video signal at the output of detector 54. The composite detected video signal is coupled via an amplifier 55 to a noise inverter 56 which in this case alters black-going blanking interval noise pulses below a given threshold level to prevent the noise pulses from disrupting the operation of subsequent sync separator circuits, and to prevent the noise pulses from interfering with automatic gain control (AGC) action.

The baseband video signal output of noise inverter 56 is coupled via a terminal 25, a buffer amplifier 57 and a switch 58 to a video signal processor 60 including, e.g., sync separator, luminance and chrominance frequency selection, and luminance and chrominance processing circuits for developing R, G, B color image representative signals as known. The baseband video output signal from noise inverter 56 is also coupled to an AGC peak detector 62 which peak detects the horizontal sync component of the baseband video signal to develop an AGC control voltage related to the magnitude of the sync component. This AGC control voltage is developed across a filter capacitor 64 coupled to a terminal 30 of circuit 45. The AGC voltage is also coupled via a current determining resistor 65 to an AGC filter network including a resistor 68 and a storage capacitor 69 connected to terminal 1 of circuit 45. A video AGC control voltage appearing at terminal 1 is coupled via an AGC amplifier 66 to a gain control input of IF amplifier stage 50 for controlling the gain of the amplifiers within stage 50 in accordance with the level of the detected sync pulse to maintain a desired signal gain for the video IF channel. The AGC voltage at terminal 1 is also applied to an RF AGC comparator amplifier 70, which provides an amplified AGC voltage to a gain control input of tuner 42 via an RF AGC circuit 72. RF AGC circuit 72 is of conventional design and includes a comparator responsive to a reference voltage and to the video AGC voltage derived from terminal 1 for providing an output gain control signal which determines the gain status (e.g., minimum or maximum gain) of tuner 42. A potentiometer 74 coupled via a terminal 2 to a reference input of comparator 70 establishes the operating threshold of RF AGC comparator 70 to determine the point at which comparator 70 conveys the video AGC control voltage to circuit 72.

An automatic fine tuning (AFT) peak detector 75, operatively associated with a bandpass filter tank 76 tuned to the 45.75 MHz video carrier, responds to the amplitude limited video IF carrier signal from limiter 52 for developing an AFT voltage which is coupled via a buffer amplifier 77 and a terminal 29 to an AFT control input of tuner 42 to maintain proper tuning of tuner 42.

In the quasi-parallel sound IF channel, the IF signal at terminals 8 and 9, including sound and video components, is coupled to an IF amplifier stage 80 which includes plural gain controllable amplifiers. An amplified IF signal from stage 80 is AC coupled to a limiter 82 which provides an amplitude limited IF signal to a sound IF detector 86 via a capacitive phase shifting network 87. Detector 86 illustratively comprises a four quadrant multiplier. A bandpass filter tank 85 coupled via terminals 22 and 23 to the output of limiter 82 is tuned to the video IF carrier. Limiter 82, detector 86 and tank 85 form a mixer for providing a 4.5 MHz FM intercarrier sound signal from the sound and video components of the IF signal. The intercarrier sound signal from detector 86 is coupled via an amplifier 88, a terminal 21, a buffer 89, a 4.5 MHz bandpass filter 90 and terminals 18 and 19 to a limiter network comprising cascaded progressive limiting stages 91, 92 and 93 which provide an amplitude limited FM intercarrier sound signal to an FM detector 95. Detector 95 operates together with a discriminator tank circuit 96 coupled to terminals 15 and 16 for generating a demodulated baseband audio signal. The audio signal is applied to an audio signal processor stage (not shown) including audio amplifiers.

As will be discussed in detail subsequently, automatic gain control of the quasi-parallel sound IF channel is achieved in response to a gain control voltage developed by video AGC detector 62 on AGC capacitor 69, as augmented by a gain control voltage developed by a decoder interface network 110 in response to a restored sync video output signal from a suppressed sync decoder 100 designed in accordance with the proposed EIA standard.

The baseband composite video signal from terminal 25 of circuit 45 is applied to a signal input of decoder 100 via buffer 57. A baseband video signal "A" with a restored horizontal sync component is provided from one output of decoder 100 to decoder interface network 110 in circuit 45 via an input terminal 12.

Interface 110 includes a comparator circuit for developing an output gain control signal related to the condition of baseband video signal "A" from the output of decoder 100, as will be discussed in detail. The gain control signal from interface 110 modifies the charge developed on video AGC filter capacitor 69 by AGC detector 62, thereby augmenting the action of the video AGC circuits particularly in the presence of received suppressed sync signals.

The video AGC voltage developed across AGC capacitor 69 is coupled via amplifier 66 to a gain control input of IF amplifiers 80 for controlling the gain of the sound channel. The gain control voltage from interface 110 also assists to control the gain of the sound channel particularly under suppressed sync conditions, since the gain control signal from interface 110 assists to control the AGC voltage developed across capacitor 69. Thus automatic gain control of both the video IF channel and the sound IF channel is accomplished in response to the gain control signal from AGC detector 62 as augmented by the gain control signal from interface 110.

With the described sound AGC technique, the sound signal level in the sound channel desirably tracks with the level of the sync restored video signal from the output of decoder 100. Unwanted amplitude modulation of the sound signal, such as may be experienced with some other types of sound AGC systems in a system for processing a suppressed sync signal, is avoided. A potentiometer 112 provides a reference voltage VR to a reference input of the comparator in interface 110.

A DC voltage "B" provided from another output of decoder 100 controls the operation of an electronic switch 115 to which a filter capacitor 117 is coupled. In the absence of decoder 100, no DC voltage is applied to switch 115 and capacitor 117 is decoupled from the AGC filter network including resistor 68 and capacitor 69. When decoder 100 is connected to the system, control voltage "B" causes switch 115 to be placed in the position shown whereby filter capacitor 117 is connected across AGC filter capacitor 69, thereby increasing the AGC time constant associated with video signal AGC action. The longer AGC time constant is necessary for stability when the decoder is active to compensate for normally expected signal processing delays (as large as 1 millisecond, or five horizontal lines) inherent in the operation of the decoder and recognized by the EIA standard. The normal, faster AGC time constant using filter capacitor 69 alone represents a compromise between a need for a time constant fast enough to accommodate a channel change condition, and a time constant slow enough to be immune to the effects of aircraft induced "flutter".

An output signal "C" from decoder 100 is a restored sync video signal developed as will be described below. The decoder output lines on which restored sync video signals "A" and "C" appear could be connected together internal to decoder 100 so that a single decoder output line results. However, some systems may require two separate decoder output lines, e.g., with one output line (C) conveying a signal with both restored sync and video information to be displayed, and another output signal line (A) conveying a composite synchronizing signal with restored sync but without video information, for a specialized use. In this example decoder output signals A and C are similar restored sync video signals containing information to be displayed.

Restored sync decoder output signal C is selectively coupled to video signal processor 60 via switch 58 and an AC coupling capacitor 120. Switch 58 can be a manual viewer controlled switch, or a microprocessor controlled electronic switch responsive to both user selection signals and automatic control signals received from the decoder, depending on the characteristics of a particular decoder system. Switch 58 is placed in a DECODE position when decoder 100 is present and operative to decode a received suppressed sync television signal. Switch 58 is placed in a NORMAL position when decoder 100 is absent or inoperative in the presence of a received television signal with proper (non-suppressed) sync.

In the presence of a suppressed sync television signal, the input signal to decoder 100 always exhibits suppressed sync because the decoder input signal line is not included in the sync restoration control loop. Briefly, the decoder input line receives only a suppressed sync signal via output 44a of SAW filter 44, IF amplifiers 50, video detector 54 and buffer 57. One decoder output line provides a restored sync video signal C to video processor 60, and another decoder output line provides a restored sync video signal A to AGC circuits of the receiver via interface network 110 for maintaining correct receiver signal gain.

The operation of decoder 100 in conjunction with interface 110 and the AGC circuits of the receiver will now be described in detail.

Decoder 100 and the AGC circuits of the receiver form an automatic gain control system for suppressed sync signal conditions. In accordance with the EIA standards, a video signal gain change is not required when the sync tip voltage is +1.0 volt. A gain change is required, however, when the sync tip voltage is more or less than +1.0 volt. More specifically, a gain change is not required when "GM" as defined in expression (1) below is substantially equal to unity, but a gain change is required when GM is other than unity:

$$GM = \frac{2.143v. - 1.0v.}{2.143v. - DRS} \quad (1)$$

where
  GM is a gain multiplier factor;
  2.143 v. is the voltage associated with the 120 IRE video signal level (zero carrier voltage);
  1.0 v. is the desired sync tip voltage level; and
  DRS is the actual sync tip voltage of a decoder restored sync component from the output of decoder 100.

When expression (1) is solved for the term DRS, expression (2) below results:

$$DRS = 2.143v. - \frac{1.143v.}{GM} \quad (2)$$

If the gain is wrong, e.g., too high as is typical for a suppressed sync signal, the decoder will produce an output DRS level (during the sync interval) of less than +1.0 volt, for example. This DRS level is sensed by interface 110 which then acts to modify the charge on AGC capacitor 69 as required to produce a desired correct signal gain and an attendant DRS sync tip voltage of approximately +1.0 volt. This is accomplished by means of comparator and current source circuits in interface network 110. The decoder itself does not produce a "correct" DRS sync tip level of +1.0 volts immediately upon receipt of a suppressed sync video signal, because the receiver would then have no means of knowing whether or not the video signal gain should be changed.

Figure 2:
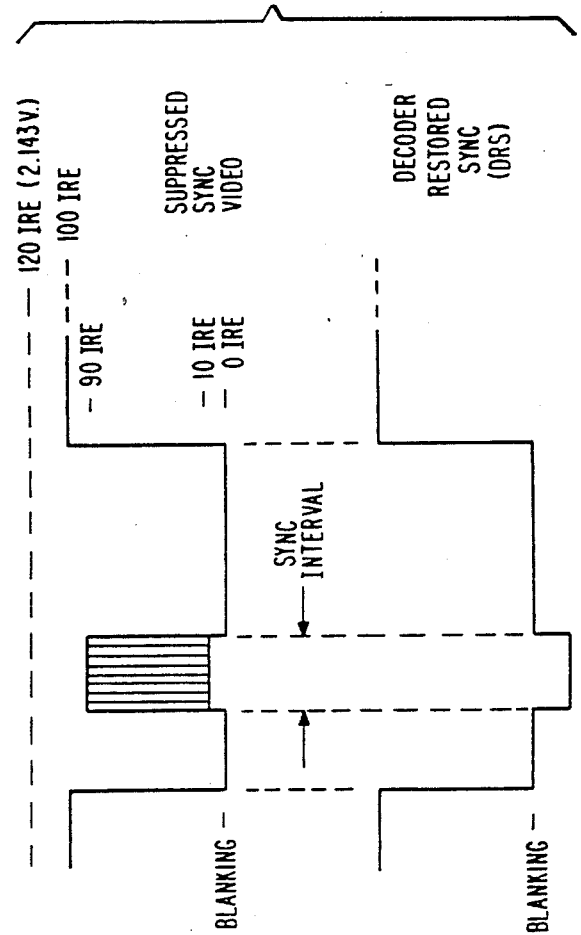
FIG. 2 illustrates signal waveforms helpful in understanding the operation of the sync restoration apparatus of FIG. 1.

Various techniques are known for developing a suppressed sync signal. FIG. 2 illustrates waveforms representing both one type of a suppressed sync signal, and a decoder restored sync (DRS) output signal from decoder 100. In the suppressed sync signal the normally negative going (below 0 IRE) horizontal sync component has been replaced with a 1 MHz burst marker of approximately 80 IRE peak-to-peak amplitude centered between the 0 IRE and 100 IRE levels. If the amplitude of the received suppressed sync signal is correct, the 80 IRE burst marker will cause a given voltage to be produced when peak detected, as will be discussed subsequently. Otherwise, under incorrect gain conditions, the amplitude detected burst marker will cause another voltage to be produced, signifying that a gain change is required. The decoder restored sync (DRS) output signal from decoder 100 has a negative-going restored sync component of a magnitude which signifies to the receiver, via interface network 110, the amount of signal gain change required, if any.

Figure 3:
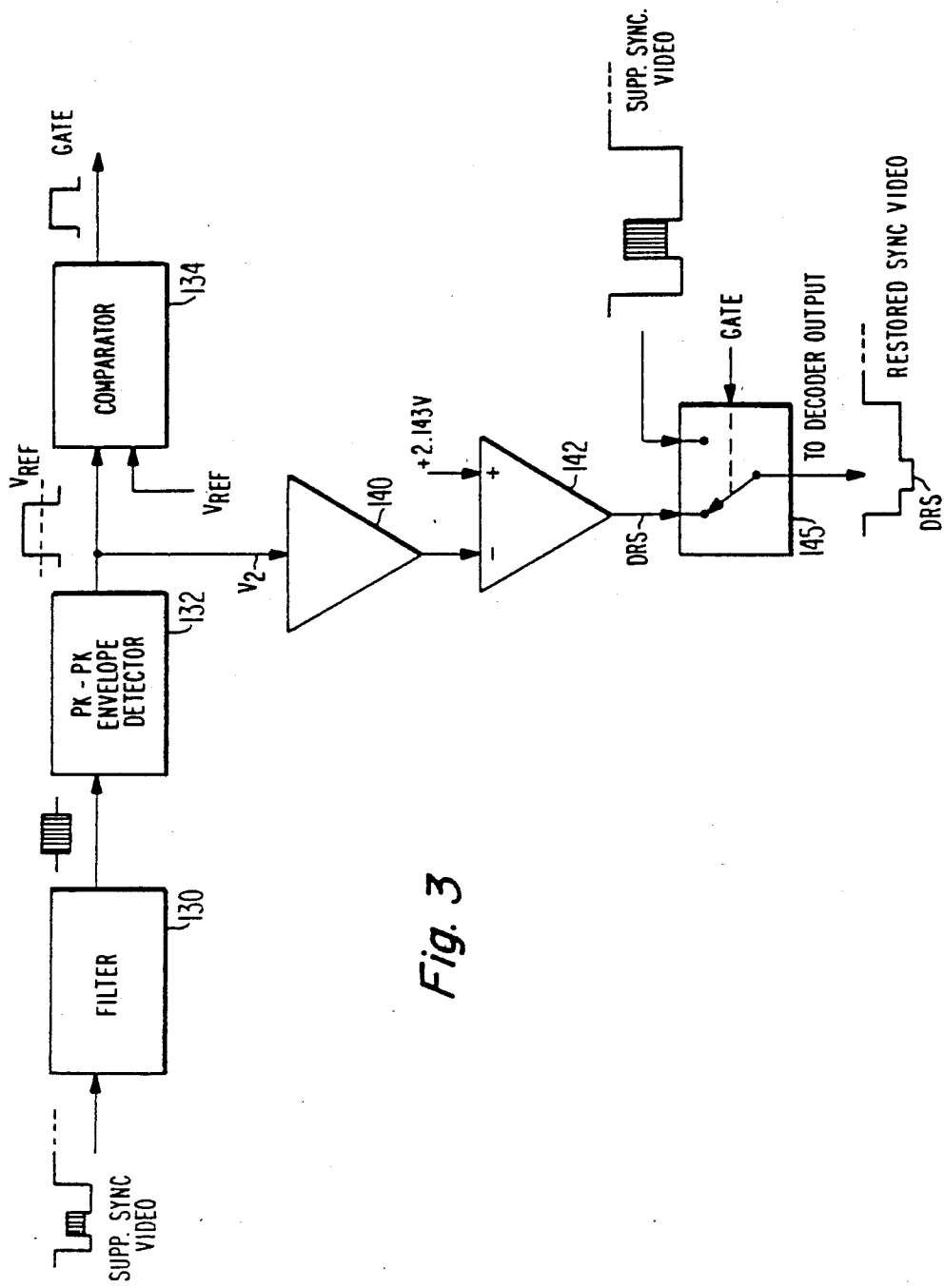
FIG. 3 shows a network, in block diagram form, suitable for use in a suppressed sync decoder included in the system of FIG. 1.

FIG. 3 illustrates a portion of a decoder arrangement suitable for restoring the sync component of a suppressed sync signal as shown in FIG. 2.

In FIG. 3, a suppressed sync video signal of the burst marker type is filtered by a bandpass filter 130 which passes the burst marker signal frequency. The filtered burst marker component is amplitude detected by a peak-to-peak envelope detector 132, which provides an output signal representative of the magnitude of the sync interval burst marker component. It is extremely unlikely that a false peak detector output will be produced by 1 MHz video signal image interval components, since 1 MHz video signal components are unlikely to appear with sufficient energy to produce an output from peak detector 132 corresponding to the detected output produced by the relatively high energy 1 MHz burst marker. The detected burst marker from detector 132 is applied to one input of a comparator 134, another input of which receives a reference voltage VREF. The magnitude of the detected burst marker signal exceeds VREF under substantially all expected conditions, whereby comparator 134 produces an output GATE timing signal coincident with the sync interval. The GATE signal signifies the presence of the sync interval, and is employed as will be discussed below.

Recall from expression (2) discussed previously that the sync tip voltage of the decoder restored sync (DRS) signal from decoder 100 is given by $$DRS = 2.143v. - \frac{1.143v}{GM} \quad (2)$$

Gain multiplier factor GM is the ratio of the constant peak-to-peak detected sync interval burst marker voltage ($V_1$) which is expected to appear at the output of detector 132 under correct signal gain conditions, to the variable peak-to-peak detected burst marker voltage ($V_2$) which is actually developed at the output of detector 132. Thus expression (2) can be rewritten as expressions (3) or (3a) below:

$$DRS = 2.143v. - \frac{1.143v.}{(V_1/V_2)} \quad (3)$$

or $$DRS = 2.143v. - [1.143v./V_1]V_2 \quad (3a)$$

Under correct video signal gain conditions $V_1 = V_2$, i.e., the burst marker amplitude is correct, whereby the DRS sync tip level is +1.0 volt as desired for correct video signal gain conditions.

The transfer function represented by expression (3a) can be implemented by means of the portion of the network in FIG. 3 including an amplifier 140 and a differential amplifier 142.

Amplifier 140 translates detected signal $V_2$ with a constant amplification factor $K = 1.143/V_1$, where $V_1$ is a constant. Amplifier 140 may act as an amplifier, an attenuator, or as a unity gain amplifier for values of K greater than unity, less than unity or unity, respectively. The output signal from amplifier 140 is applied to an inverting input (−) of a differential amplifier 142. A reference voltage of +2.143 volts is applied to a non-inverting input (+) of differential amplifier 142. Amplifier 142 provides an output DRS voltage in accordance with expression (3a).

The DRS output voltage from amplifier 142 is applied to one input of an electronic switch 145, another input of which receives the suppressed sync video signal, e.g., as derived from input circuits of decoder 100. The position of switch 145 is controlled by the GATE signal from the output of comparator 134 such that during each sync interval switch 145 is placed in the position shown for conveying the DRS voltage to the decoder output. At other times, when the GATE signal is absent, switch 145 is placed in its other position whereby the remaining portion of the video signal is conveyed to the decoder output. Thus during each sync interval switch 145 substitutes the DRS voltage from amplifier 142 for the burst marker in the suppressed sync video signal to thereby produce a video signal with a restored sync component at the output of the decoder.

As mentioned previously, the sync tip voltage of the restored sync video signal will be substantially equal to +1.0 volt under correct signal gain conditions, or less than +1.0 volt if the gain is too high, for example. The latter condition will be sensed by interface network 110, which will act to adjust the video and sound AGC circuits of the receiver to produce correct signal gain. Under incorrect signal gain conditions, the AGC circuits of the receiver will respond to a control current output of interface network 110 related to the DRS output level of decoder 100 for incrementally changing the signal gain toward the desired correct gain. The video AGC circuit action causes the amplitude of the suppressed sync video signal applied to the input of decoder 100 to incrementally approach the correct peak-to-peak video signal amplitude, and the restored sync component of video signals A and C from the output of decoder 100 will incrementally approach the desired correct value of +1.0 volt. The action of the sound AGC circuit tracks with that of the video AGC circuit.

The operation of the receiver AGC system for both normal and suppressed sync conditions is described in detail below with regard to FIGS. 4–7.

Figure 4:
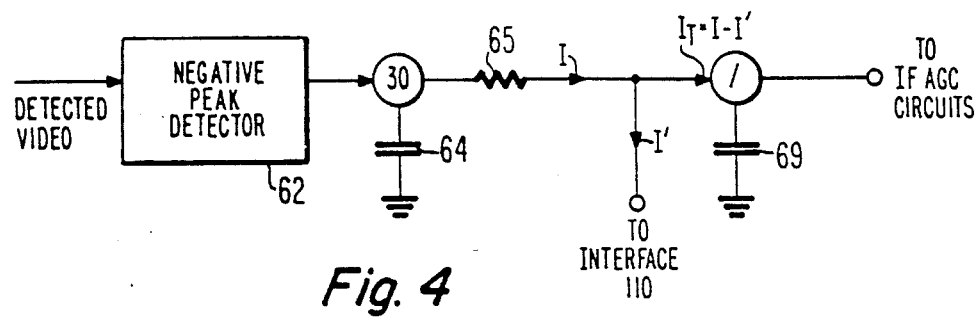
FIG. 4 depicts a simplified version of a portion of AGC circuits of the receiver.

FIG. 4 depicts a simplified version of the receiver video AGC system of FIG. 1, wherein corresponding elements are identified by the same reference number. AGC detector 62, a negative peak detector, charges capacitor 64 with a voltage related to the magnitude of the negative-going peaks of the detected baseband video signal, i.e., the sync tips in the case of a conventional television signal. Resistor 65 converts the voltage on capacitor 64 to a current I which represents a charging component of AGC capacitor 69. A current I' conducted by a current source associated with interface network 110 represents a discharging component of capacitor 69. The magnitude of current I' varies in accordance with the nature of a given suppressed sync condition. A total AGC current $I_T$ equal to the difference between currents I and I' represents the net charging current of capacitor 69 and serves to develop a voltage across capacitor 69 which is conveyed to AGC circuits of the receiver via amplifiers 66 and 70. Current $I_T$ equals zero for correct gain steady state conditions.

Figure 5:
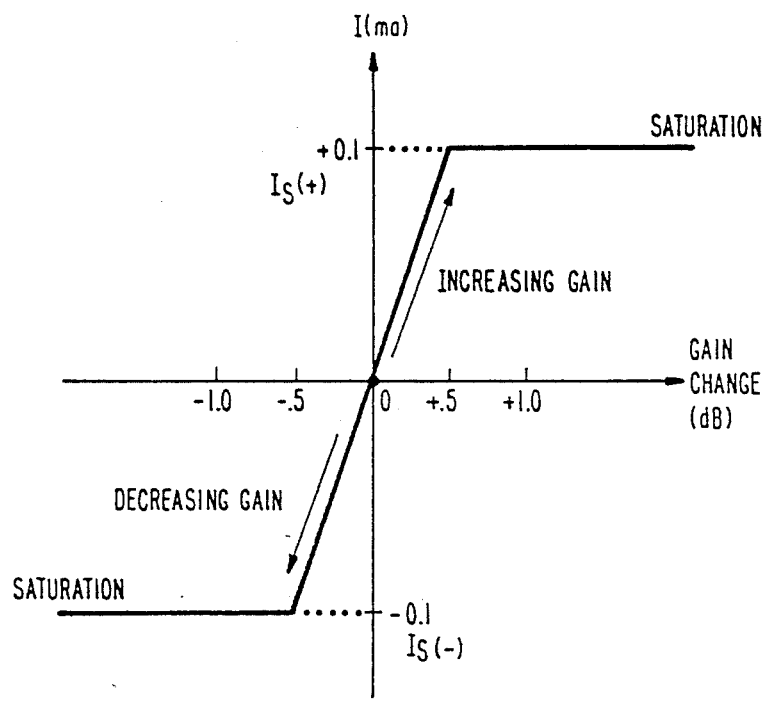
FIG. 5 illustrates a transfer characteristic of an AGC detector associated with the receiver AGC circuits.

AGC detector 62 exhibits a gain change vs. current conduction characteristic as shown in FIG. 5. The detector exhibits a linear gain change up to a gain increase of +0.5 db and up to a gain decrease of −0.5 db, and a nonlinear response for gain changes above and below 0.5 db and −0.5 db. Detector 62 operates in a saturated region in the nonlinear case, exhibiting either a positive saturation current output $I_s(+)$ or a negative saturation current output $I_s(-)$. In the saturated region the rate at which the voltage on capacitor 69 is permitted to change is restricted to help maintain the stability of the AGC control loop. An AGC detector characteristic with linear and nonlinear (saturated) regions such as that illustrated is well known and widely used in television receiver AGC systems.

With the decoder connected to the receiver under suppressed sync conditions, correct signal gain will be established for steady state conditions. The internal AGC system of the receiver alone would be unable to achieve correct gain under suppressed sync signal conditions, and would produce a signal with too much gain. The overall AGC system including the combination of decoder 100, interface 110 and the existing internal AGC system of the receiver operates in a similar way to the way the internal AGC system of the receiver operates alone under normal, non-suppressed sync conditions to establish correct gain. Under steady state conditions when correct gain is achieved and the DRS sync tip voltage substantially equals +1.0 volt, current I conducted to terminal 1 from the output of peak detector 62 substantially equals current I' conducted from terminal 1 via interface 110, i.e., interface current I' opposes current I to maintain a correct gain condition.

Figures 6, 7:
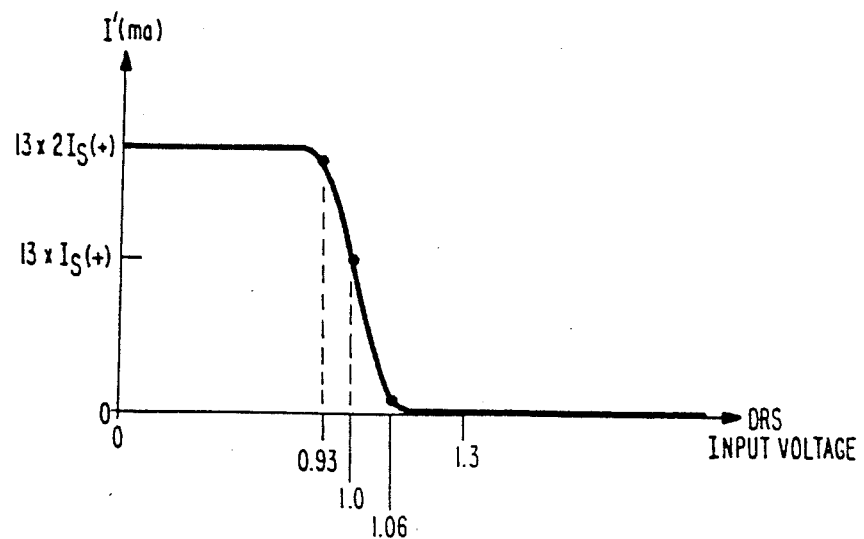
FIG. 6 is a table summarizing operating characteristics of the disclosed sync restoration and gain control apparatus.
FIG. 7 illustrates the transfer characteristic of a decoder interface network included in the system of FIG. 1.

FIGS. 6 and 7 illustrate the operation of the system for correct gain (steady state) and incorrect gain conditions with respect to both normal sync and suppressed sync video signals. As seen from FIG. 6, for a steady state correct gain condition manifested by a DRS sync tip voltage of substantially +1.0 volt, currents I and I' both exhibit a magnitude equal to that of detector saturation current $I_s(+)$, and AGC current $I_T$ is zero whereby no gain change is produced. FIG. 6 also indicates the magnitudes of current I, I' and $I_T$ for an incorrect high gain condition with a decoder restored sync tip voltage of less than +1.0 volt (initially, before correction is achieved), and for an incorrect low gain condition with a decoder restored sync tip voltage of greater than +1.0 volt (initially). A high gain condition is typically experienced with a suppressed sync signal. A low gain condition is uncommon, but can arise momentarily due to an "overcorrection" which may exist briefly before the DRS gain control action has stabilized just before correct gain is achieved.

The values of interface current I' shown in the table of FIG. 6 are produced in accordance with the voltage versus current response of interface network 110, which is illustrated by FIG. 7.

As seen from FIG. 7, interface network 110 produces an output current I' equal to 13 times saturation current $I_s(+)$ when the DRS sync tip voltage is substantially equal to +1.0 volt under correct signal gain conditions. The "13 times" multiplier factor is required because the interface network develops output current I' only during each horizontal synchronizing interval in response to the DRS signal from decoder 100. That is, current I is a horizontal rate current pulse rather than a continuous DC current. The horizontal synchronizing interval encompasses only about 1/13 of the total horizontal line interval. Without the "13 times" multiplier, interface output current I', which must reach the $I_s$ and $2I_s$ levels would average only 1/13 of the level required to produce the desired $I_s$ and $2I_s$ levels. The "13 times" multiplier assures that current I' can reach the $I_s$ and $2I_s$ levels.

Interface network 110 is inactive (nonconductive and produces a substantially zero output current fo input voltages of approximately +1.3 volts and greater where +1.3 volts corresponds to the blanking level of a restored sync signal with correct gain. Breakpoint voltages +0.93 volts and +1.06 volts are the voltages required to achieve results consistent with the AGC detector characteristic shown in FIG. 5. Specifically, breakpoint voltages +0.93 volts and +1.06 volts for the interface transfer characteristic of FIG. 7 respectively relate to the −0.5 db and +0.5 db gain change breakpoints for the AGC detec characteristic of FIG. 5. Illustratively, a linear reduction in gain of from 0 to −0.5 db (FIG. 5) is associated with a DRS sync tip voltage of from +1.0 to +0.93 volts (FIG. 7). In FIG. 5 a nonlinear gain reduction region from −0.5 db to −1.0 db and beyond is associated with a DRS sync tip voltage of less than +0.93 volts in FIG. 7.

The transfer characteristic of FIG. 7 is exhibited by a differential comparator with an associated current source, within interface network 110. For example, the comparator may be of the type including a pair of differentially connected transistors with interconnected emitters coupled to a common current source. Output currents are conducted via a collector output of one of the transistors, coupled to capacitor 69 via terminal 1. As determined by the gain and biasing of the differential comparator, the comparator exhibits a saturation region up to the 0.93 v. breakpoint, a linear transition region between the +0.93 v. and the +1.06 v. breakpoints, and a cut-off region above the +1.06 v. breakpoint.

The disclosed arrangement can also be used in conjunction with a video cassette recorder (VCR). In such case a scrambled, suppressed sync television signal can be applied to a decoder for developing a restored sync video signal which would be provided as an input signal to an interface network in the VCR. The interface network would provide a control signal to AGC circuits of the VCR, and the VCR would provide a gain controlled, restored sync video information signal to a television receiver which need not include a decoder interface network.

What is claimed is:

1. In a video signal processing system with a quasi-parallel IF network including a video IF channel for reproducing sound information and having a signal input and a gain control input, and including a sound IF channel gain control input, apparatus comprising:
   means for generating a gain control signal with a magnitude related to the magnitude of a video signal processed by said system;
   means for coupling said gain control signal to said gain control input of said video IF channel for controlling the gain thereof; and
   means for coupling said gain control signal to said gain control input of said sound IF channel for controlling the gain thereof.

2. In a system for processing a broadcast type television signal and intended to receive a detected video signal from a video signal decoder responsive to a scrambled video signal detected by said system, said system having a video signal channel including input means for receiving a broadcast type television signal and video detector means responsive to a received television signal for providing said detected video signal, and a seperate sound channel, apparatus comprising:
   interface means for receiving an unscrambled video signal derived from a received scrambled television signal, said interface means providing a control signal with a magnitude related to a parameter of said unscrambled video signal;
   means for coupling said control signal to said video channel for maintaining a desired signal gain for said video channel in the presence of a received scrambled television signal; and
   means for coupling said control signal to said sound channel for maintaining a desired signal gain for said sound channel in the presence of a received scrambled television signal.

3. Apparatus according to claim 2, wherein:
   said scrambled television signal exhibits a suppressed synchronizing (sync) component;
   said unscrambled video signal received by said interface means has a restored sync component; and
   said control signal has a magnitude related to the magnitude of said restored sync component.

4. Apparatus according to claim 2 wherein
   a video automatic gain (AGC) network normally maintains a desired gain for said video channel;
   a sound AGC network normally maintains a desired gain for said sound channel;
   said video channel includes video intermediate frequency (IF) signal processing means responsive to a gain control signal provided by said video AGC network and responsive to said control signal; and
   said sound channel includes sound IF signal processing means responsive to a gain control signal provided by said sound AGC network and responsive to said control signal.

5. Apparatus according to claim 3, wherein
   said interface means comprises a comparator with a reference input, an input for receiving a video signal with a restored sync component, and an output coupled to said video channel and to said sound channel; said comparator providing said control signal with a magnitude in accordance with the magnitude of said restored sync component relative to a reference level.

6. In a system for processing a broadcast type television signal, said system intended to receive a detected video signal from a video signal decoder responsive to a scrambled video signal with a suppressed synchronizing (sync) component detected by said system for producing a restored sync component signal, apparatus comprising:
   input means for receiving a television signal, said input means including means for producing an intermediate frequency (IF) signal including a video IF component and a sound IF component;
   a video channel for processing said video IF component;
   a separate sound channel for processing said sound IF component;
   detector means responsive to said video IF component for producing a detected baseband video signal;
   automatic gain control means responsive to said detected video signal for providing a first gain control signal to respective gain control inputs of said video channel and of said sound channel;
   interface means with an input for receiving a baseband video signal with said restored sync component video signal derived from a received scrambled television signal; said interface means providing a second control signal with a magnitude related to the magnitude of said restored sync component;
   means for coupling said second control signal to a gain control input of said video channel for maintaining a desired gain for said video chnnel in the presence of a received television signal with a suppressed sync component; and means for coupling said second control signal to a gain control input of said sound channel for maintaining a desired gain for said sound channel in the presence of a received television signal with a suppressed sync component.

* * * * *

UNITED STATES PATENT AND TRADEMARK OFFICE
CERTIFICATE OF CORRECTION

PATENT NO. : 4,718,086

DATED : January 5, 1988

INVENTOR(S) : Mark Francis Rumreich et al.

It is certified that error appears in the above-identified patent and that said Letters Patent is hereby corrected as shown below:

Column 2, line 57, "systm" should be -- system --.

Column 10, line 68, "(nonconductive" should be -- (nonconductive) --.

Column 11, line 9, "detec" should be -- detector --.

Column 11, line 43 (claim 1) "sound" should be -- video --.

Column 11, line 45 (claim 1) after "channel" insert -- for reproducing sound information and having a signal input and a" --.

Column 12, line 16 after "claim 2" insert -- , --.

Column 13, line 1 (claim 6) "chnnel" should be -- channel --.

Signed and Sealed this

Thirteenth Day of December, 1988

Attest:

DONALD J. QUIGG

*Attesting Officer*  *Commissioner of Patents and Trademarks*